United States Patent
Li et al.

(10) Patent No.: US 9,916,805 B2
(45) Date of Patent: Mar. 13, 2018

(54) GOA CIRCUIT FOR LTPS-TFT

(71) Applicant: Wuhan China Star Optoelectronics Technology Co., Ltd., Wuhan (CN)

(72) Inventors: Yafeng Li, Wuhan (CN); Jinfang Wu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 271 days.

(21) Appl. No.: 14/913,991

(22) PCT Filed: Jan. 28, 2016

(86) PCT No.: PCT/CN2016/072428
§ 371 (c)(1),
(2) Date: Feb. 23, 2016

(87) PCT Pub. No.: WO2017/101200
PCT Pub. Date: Jun. 22, 2017

(65) Prior Publication Data
US 2018/0033389 A1 Feb. 1, 2018

(30) Foreign Application Priority Data
Dec. 17, 2015 (CN) .......................... 2015 1 0954368

(51) Int. Cl.
*G09G 3/36* (2006.01)
*G09G 3/20* (2006.01)

(52) U.S. Cl.
CPC ......... *G09G 3/3677* (2013.01); *G09G 3/2092* (2013.01); *G09G 3/3696* (2013.01);
(Continued)

(58) Field of Classification Search
CPC ......... G09G 3/3677; G09G 2310/0286; G09G 2310/0283; G09G 2300/0408;
(Continued)

(56) References Cited

U.S. PATENT DOCUMENTS 9,190,170 B1 * 11/2015 Hao ..................... G09G 3/3677
2013/0077736 A1 * 3/2013 Son ......................... G09G 3/20
377/69

(Continued)

FOREIGN PATENT DOCUMENTS

CN 104485079 A * 4/2015 ........... G09G 3/3648

*Primary Examiner* — Hong Zhou
(74) *Attorney, Agent, or Firm* — Leong C. Lei

(57) ABSTRACT

The invention provides a GOA circuit for LTPS-TFT, by adding the twelfth and thirteenth TFTs (T12, T13) controlled by output ends (G(n−1), G(n+1)) of (n−1)-th and (n+1)-th GOA units, the drain of twelfth TFT T12 connected through the fourth node (W1(n)) to source of first TFT (T1), the drain of first TFT (T1) connected to output end of (n−1)-th GOA unit, the drain of thirteenth TFT (T13) connected through the fifth node W2(n) to source of third TFT (T3), the drain of third TFT (T3) connected to output end of (n+1)-th GOA unit; the first and third TFTs (T1, T3) controlled respectively by the forward and backward scan DC control signals (U2D, D2U) to reduce leakage of twelfth TFT (T12) in forward scanning and leakage of thirteenth TFT (T13) in backward scanning. As such, the leakage in key TFTs is reduced and GOA circuit stability is improved.

13 Claims, 8 Drawing Sheets

(52) U.S. Cl.
CPC ........... *G09G 2300/0408* (2013.01); *G09G 2310/0283* (2013.01); *G09G 2310/08* (2013.01); *G09G 2320/0214* (2013.01)

(58) Field of Classification Search
CPC ......... G09G 3/3266; G09G 2310/0289; G09G 2310/0281; G09G 3/3648; G09G 3/3674; G09G 3/3696; G09G 3/2092; G09G 2310/0267; G09G 2300/0871; G09G 2310/0202; G09G 2310/0213; G09G 2310/08; G09G 2320/0214; G11C 19/28
See application file for complete search history.

(56) References Cited

U.S. PATENT DOCUMENTS

| | | | | |
|---|---|---|---|---|
| 2014/0049712 | A1* | 2/2014 | Yu | G02F 1/13306 349/34 |
| 2015/0187323 | A1* | 7/2015 | Jin | G09G 5/003 345/215 |
| 2016/0019976 | A1* | 1/2016 | Pai | G09G 3/3266 345/204 |
| 2016/0187917 | A1* | 6/2016 | Lou | G09G 3/2096 345/213 |
| 2016/0189795 | A1* | 6/2016 | Chen | G09G 3/20 377/70 |

* cited by examiner

GOA CIRCUIT FOR LTPS-TFT

BACKGROUND OF THE INVENTION

1. Field of the Invention

The present invention relates to the field of display, and in particular to a gate driver on array (GOA) circuit for thin film transistor (TFT) based on low temperature poly-silicon (LTPS) semiconductor.

2. The Related Arts

As the liquid crystal display (LCD) shows the advantages of being thin, low power-consumption, and no radiation, the LCD is widely used in various devices, such as, liquid crystal TV, mobile phones, PDA, digital camera, PC monitors or notebook PC screens as well as the leading technology in tablet PCs.

The gate driver on array (GOA) technology is the array substrate column drive technology, by using the array substrate process for the LCD panel to manufacture the driver circuit for the horizontal scan line in the area around the active area on the substrate to replace the external integrated circuit (IC) to perform driving the horizontal scan lines. GOA technology can reduce the bonding process for the external IC and reduce cost, as well as the ability to realize narrow-border or borderless panels, and is used by many types of displays.

As the low temperature poly-silicon (LTPS) semiconductor TFT develops, the LTPS-TFT LCD gains much attention. The LTPS-TFT LCD has the advantages of high resolution, fast response, high luminance, and high opening ratio. Because the LTPS has a more orderly arrangement than the a-Si, the LTPS has ultra-high electron migration rate, 100 times higher than the a-Si. The LTPS can use GOA technology to manufacture the gate driver circuit on the TFT substrate to achieve system integration, save space and the cost for driver IC.

Refer to FIG. 1. The known GOA circuit for LTPS-TFT comprises: a plurality of cascade GOA units, for a positive integer n, the n-th stage GOA unit comprising: a first TFT T1, with the gate connected to the output end G(n−1) of the (n−1)-th stage GOA unit, drain connected to the forward scan direct current (DC) control signal U2D, and the source connected to the third node H(n); a second TFT T2, with the gate connected to the first node Q(n), drain connected to the output end G(n), and the source connected to the M-th clock signal CK(M); a third TFT T3, with the gate connected to the output end G(n+1) of the (n+1)-th stage GOA unit, source connected to the third node H(n), and drain connected to the backward scan DC control signal D2U; a fourth TFT T4, with the gate connected to the (M+1)-th clock signal CK(M+1), source connected to the output end G(n), and drain connected to a constant low voltage VGL; a fifth TFT T5, with the gate connected to a constant high voltage VGH, source connected to the third node H(n), and drain connected to first node Q(n); a sixth TFT T6, with the gate connected to the (M+1)-th clock signal CK(M+1), source connected to the third node H(n), and drain connected to a constant low voltage VGL; a seventh TFT T7, with the gate connected to the second node P(n), source connected to the third node H(n), and drain connected to a constant low voltage VGL; an eighth TFT T8, with the gate connected to the second node P(n), source connected to the output end G(n), and drain connected to a constant low voltage VGL; a ninth TFT T9, with the gate connected to the (M+1)-th clock signal CK(M+1), source connected to the second node P(n), and drain connected to a constant low voltage VGL; a tenth TFT T10, with the gate connected to the M-th clock signal CK(M), source connected to the constant high voltage VGH, and drain connected to the second node P(n); a eleventh TFT T11, with the gate connected to the third node H(n), source connected to the second node P(n), and drain connected to a constant low voltage VGL; a first capacitor C1, with one end connected to the first node Q(n) and the other end connected to the output end G(n); and a second capacitor C2, with one end connected to the second node P(n) and the other end connected to the constant low voltage VGL.

The known GOA circuit can scan forward or backward. During forward scanning, as shown in FIG. 2, the forward scan DC control signal U2D is high and the backward scan DC control signal D2U is low; during backward scanning, the forward scan DC control signal U2D is low and the backward scan DC control signal D2U is high.

In the known GOA circuit in FIG. 1, the first TFT T1 and the third TFT T3 form the control unit for forward or backward scanning. Al referring to FIG. 2, when the forward scanning reaches the time that the output end G(n) and the first node Q(n) remaining at low level, the output end G(n+1) of the (n+1)-th GOA unit, the output end G(n−1) of the (n−1)-th GOA unit, and the first node Q(n) are all at low level, the forward scan DC control signal U2D is at high level, then the voltage Vgs between the gate and the source of the first TFT T1 is Vgs=0V, and the voltage Vgs between the drain and the source is Vgs=VGH−VGL; the voltage Vgs between the gate and the source of the third TFT T3 is Vgs=0V, and the voltage Vgs between the drain and the source is Vgs=0V. Also referring to FIG. 3 of the I-V relation of TFT under different gate-to-drain voltage, when the voltage Vgs between the gate and source is Vgs=0V, the higher the drain-to-source voltage Vgs is, the larger the current of the TFT. With respect to the TFT T1 and TFT T3, the current in the first TFT T1 is larger than the current in the third TFT T3. At this point, the first TFT T1 and the third TFT T3 are both turned off, wherein a high current in a TFT in turn-off state will cause leakage. That is, the first TFT T1 is leaking the current. On the other hand, when the GOA circuit is in backward scanning and reaches the time that the output end G(n) and the first node Q(n) remaining at low level, the current in the third TFT T3 is larger than the current in the first TFT T1, and the third TFT T3 is in the leakage state. The leakage will cause the instability in the known GOA circuit.

SUMMARY OF THE INVENTION

The object of the present invention is to provide a GOA circuit for LTPS-TFT, able to reduce the leakage current in the key TFT to enhance the GOA circuit stability.

To achieve the above object, the present invention provides a GOA circuit for LTPS-TFT, which comprises: a plurality of cascade GOA units, each GOA unit comprising: a forward and backward scan control unit, an output unit and a node control unit; for a positive integer n, other than the GOA unit in the first and the last stages, in the n-th GOA unit, the forward and backward scan control unit comprising: a first TFT, with a gate connected to a forward scan DC control signal, a drain connected to an output end of the (n−1)-th GOA unit, and a source connected to a fourth node; a twelfth TFT, with a gate connected to the output end of the (n−1)-th GOA unit, a drain connected to the fourth node, and a source connected to a third node; a third TFT, with a gate connected to the backward scan DC control signal, a source connected to a fifth node, and a drain connected to an output end of the (n+1)-th GOA unit; and a thirteenth TFT, with a gate connected to the output end of the (n+1)-th GOA unit, a drain connected to the fifth node, and a source connected to the third node; the output unit comprising: a second TFT, with a gate connected to a first node, a source connected to an M-th clock signal, and a drain connected to an output end; and a first capacitor, with one end connected to the first node and the other end connected to the output end; the node control unit comprising: a fourth TFT, with a gate connected to the (M+1)-th clock signal, a source connected to the output end, and a drain connected to a constant low voltage; a fifth TFT, with a gate connected to a constant high voltage, a source connected to the third node, and a drain connected to the first node; a sixth TFT, with a gate connected to the (M+1)-th clock signal, a source connected to the third node, and a drain connected to the constant low voltage; a seventh TFT, with a gate connected to a second node, a source connected to the third node, and a drain connected to the constant low voltage; an eighth TFT, with a gate connected to the second node, a source connected to the output end, and a drain connected to the constant low voltage; a ninth TFT, with a gate connected to the (M+1)-th clock signal, a source connected to the second node, and a drain connected to the constant low voltage; a tenth TFT, with a gate connected to the M-th clock signal, a source connected to the constant high voltage, and a drain connected to the second node; an eleventh TFT, with a gate connected to the third node, a source connected to the second node, and a drain connected to the constant low voltage; and a second capacitor, with one end connected to the second end and the other end connected to the constant low voltage; the forward scan DC control signal and the backward scan DC control signal having opposite voltage levels.

The GOA circuit for LTPS-TFT has both forward scanning and backward scanning capabilities; when the forward scanning entering the time of the output end and the first node maintaining low level, the voltage between the gate and the source of the twelfth TFT is 0V and the voltage between the drain and the source is 0V, and the third TFT and the thirteenth TFT are both turned off; when the backward scanning entering the time of the output end and the first node maintaining low level, the voltage between the gate and the source of the thirteenth TFT is 0V and the voltage between the drain and the source is 0V, and the first TFT and the twelfth TFT are both turned off.

In the first GOA unit, the drain of the first TFT is connected to a circuit activation signal.

In the last GOA unit, the drain of the third TFT is connected to a circuit activation signal.

When the forward scan DC control signal is high and the backward scan DC control signal is low, the forward scanning is performed.

When the forward scan DC control signal is low and the backward scan DC control signal is high, the backward scanning is performed.

The clock signal comprises two signals: a first clock signal and a second clock signal, when the M-th clock signal is the second clock signal, the (M+1)-th clock signal is the first signal.

The TFTs are all of the N-type LTPS-TFTs.

The present invention also provides a GOA circuit for LTPS-TFT, which comprises: a plurality of cascade GOA units, each GOA unit comprising: a forward and backward scan control unit, an output unit and a node control unit; for a positive integer n, other than the GOA unit in the first and the last stages, in the n-th GOA unit, the forward and backward scan control unit comprising: a first TFT, with a gate connected to a forward scan DC control signal, a drain connected to an output end of the (n−1)-th GOA unit, and a source connected to a fourth node; a twelfth TFT, with a gate connected to the output end of the (n−1)-th GOA unit, a drain connected to the fourth node, and a source connected to a third node; a third TFT, with a gate connected to a backward scan DC control signal, a source connected to a fifth node, and a drain connected to an output end of the (n+1)-th GOA unit; and a thirteenth TFT, with a gate connected to the output end of the (n+1)-th GOA unit, a drain connected to the fifth node, and a source connected to the third node; the output unit comprising: a second TFT, with a gate connected to a first node, a source connected to an M-th clock signal, and a drain connected to an output end; and a first capacitor, with one end connected to the first node and the other end connected to the output end; the node control unit comprising: a fourth TFT, with a gate connected to the (M+1)-th clock signal, a source connected to the output end, and a drain connected to a constant low voltage; a fifth TFT, with a gate connected to a constant high voltage, a source connected to the third node, and a drain connected to the first node; a sixth TFT, with a gate connected to the (M+1)-th clock signal, a source connected to the third node, and a drain connected to the constant low voltage; a seventh TFT, with a gate connected to a second node, a source connected to the third node, and a drain connected to the constant low voltage; an eighth TFT, with a gate connected to the second node, a source connected to the output end, and a drain connected to the constant low voltage; a ninth TFT, with a gate connected to the (M+1)-th clock signal, a source connected to the second node, and a drain connected to the constant low voltage; a tenth TFT, with a gate connected to the M-th clock signal, a source connected to the constant high voltage, and a drain connected to the second node; an eleventh TFT, with a gate connected to the third node, a source connected to the second node, and a drain connected to the constant low voltage; and a second capacitor, with one end connected to the second end and the other end connected to the constant low voltage; the forward scan DC control signal and the backward scan DC control signal having opposite voltage levels; wherein the GOA circuit for LTPS-TFT has both forward scanning and backward scanning capabilities; when the forward scanning entering the time of the output end and the first node maintaining low level, the voltage between the gate and the source of the twelfth TFT is 0V and the voltage between the drain and the source is 0V, and the third TFT and the thirteenth TFT are both turned off; when the backward scanning entering the time of the output end and the first node maintaining low level, the voltage between the gate and the source of the thirteenth TFT is 0V and the voltage between the drain and the source is 0V, and the first TFT and the twelfth TFT are both turned off; in the first GOA unit, the drain of the first TFT is connected to a circuit activation signal; in the last GOA unit, the drain of the third TFT is connected to a circuit activation signal.

Compared to the known techniques, the present invention provides the following advantages: the present invention provides a GOA circuit for LTPS-TFT, by adding the twelfth and thirteenth TFTs controlled by output ends of (n−1)-th and (n+1)-th GOA units, the drain of twelfth TFT connected through the fourth node to the source of first TFT, the drain of first TFT connected to output end of (n−1)-th GOA unit, the drain of thirteenth TFT connected through the fifth node to the source of third TFT, the drain of third TFT connected to the output end of (n+1)-th GOA unit; the first and the third TFTs being controlled respectively by the forward and backward scan DC control signals; when the forward scanning entering the time of output end and first node maintaining low, the fourth being low and able to reduce leakage in twelfth TFT; when the backward scanning entering the time of output end and first node maintaining low, the fifth being low and able to reduce leakage in thirteenth TFT. As such, the leakage in key TFTs is reduced and GOA circuit stability is improved.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 4:
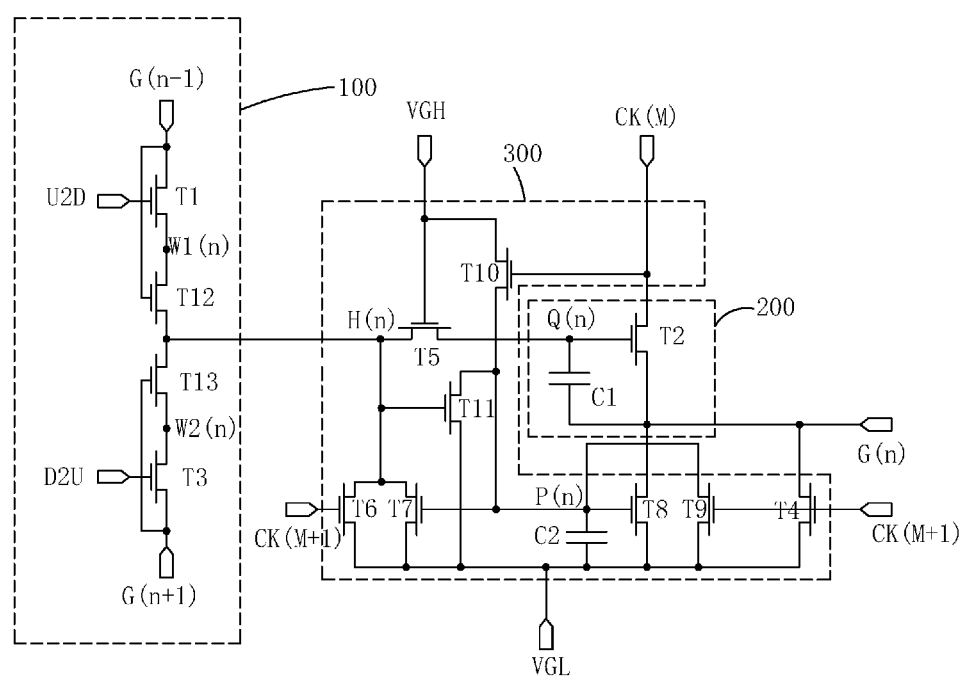
FIG. 4 is a schematic view showing the GOA circuit for LTPS-TFT provided by an embodiment of the present invention.

Refer to FIG. 4. The present invention provides a GOA circuit for LTPS-TFT, which comprises: a plurality of cascade GOA units, each GOA unit comprising: a forward and backward scan control unit 100, an output unit 200 and a node control unit 300.

For a positive integer n, other than the GOA unit in the first and the last stages, in the n-th GOA unit, the forward and backward scan control unit 100 comprises: a first TFT T1, with a gate connected to a forward scan DC control signal U2D, a drain connected to an output end G(n−1) of the (n−1)-th GOA unit, and a source connected to a fourth node W1(n); a twelfth TFT T12, with a gate connected to the output end G(n−1) of the (n−1)-th GOA unit, a drain connected to the fourth node W1(n), and a source connected to a third node H(n); a third TFT T3, with a gate connected to a backward scan DC control signal D2U, a source connected to a fifth node W2(n), and a drain connected to an output end G(n+1) of the (n+1)-th GOA unit; and a thirteenth TFT T13, with a gate connected to the output end G(n+1) of the (n+1)-th GOA unit, a drain connected to the fifth node W2(n), and a source connected to the third node H(n).

The output unit 200 comprises: a second TFT T2, with a gate connected to a first node the Q(n), a source connected to an M-th clock signal CK(M), and a drain connected to an output end G(n); and a first capacitor C1, with one end connected to the first node Q(n) and the other end connected to the output end G(n).

The node control unit 300 comprises: a fourth TFT T4, with a gate connected to the (M+1)-th clock signal CK(M+1), a source connected to the output end G(n), and a drain connected to the constant low voltage VGL; a fifth TFT T5, with a gate connected to a constant high voltage VGH, a source connected to the third node H(n), and a drain connected to the first node Q(n); a sixth TFT T6, with a gate connected to the (M+1)-th clock signal CK(M+1), a source connected to the third node H(n), and a drain connected to the constant low voltage VGL; a seventh TFT T7, with a gate connected to a second node P(n), a source connected to the third node H(n), and a drain connected to the constant low voltage VGL; an eighth TFT T8, with a gate connected to the second node P(n), a source connected to the output end G(n), and a drain connected to the constant low voltage VGL; a ninth TFT T9, with a gate connected to the (M+1)-th clock signal CK(M+1), a source connected to the second node P(n), and a drain connected to the constant low voltage VGL; a tenth TFT T10, with a gate connected to the M-th clock signal CK(M), a source connected to the constant high voltage VGH, and a drain connected to the second node P(n); an eleventh TFT T11, with a gate connected to the third node H(n), a source connected to the second node P(n), and a drain connected to the constant low voltage VGL; and a second capacitor C2, with one end connected to the second end P(n) and the other end connected to the constant low voltage VGL.

Specifically, the TFTs are all of the N-type LTPS-TFTs.

Figure 7:
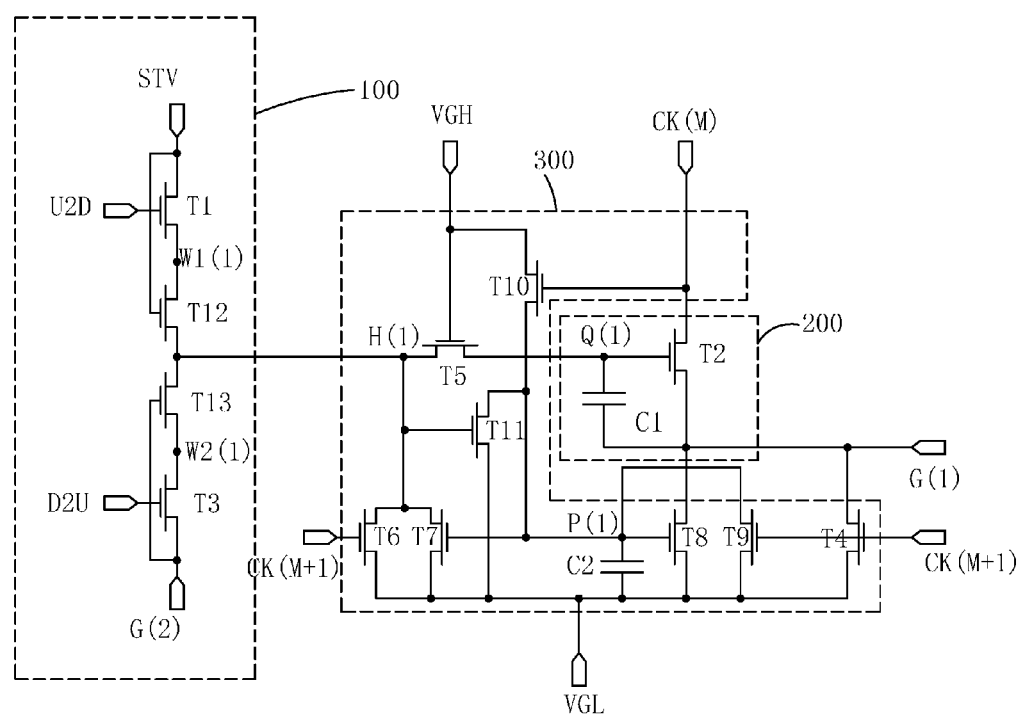
FIG. 7 is a schematic view showing the GOA circuit in the first unit for LTPS-TFT provided by an embodiment of the present invention.
Figure 8:
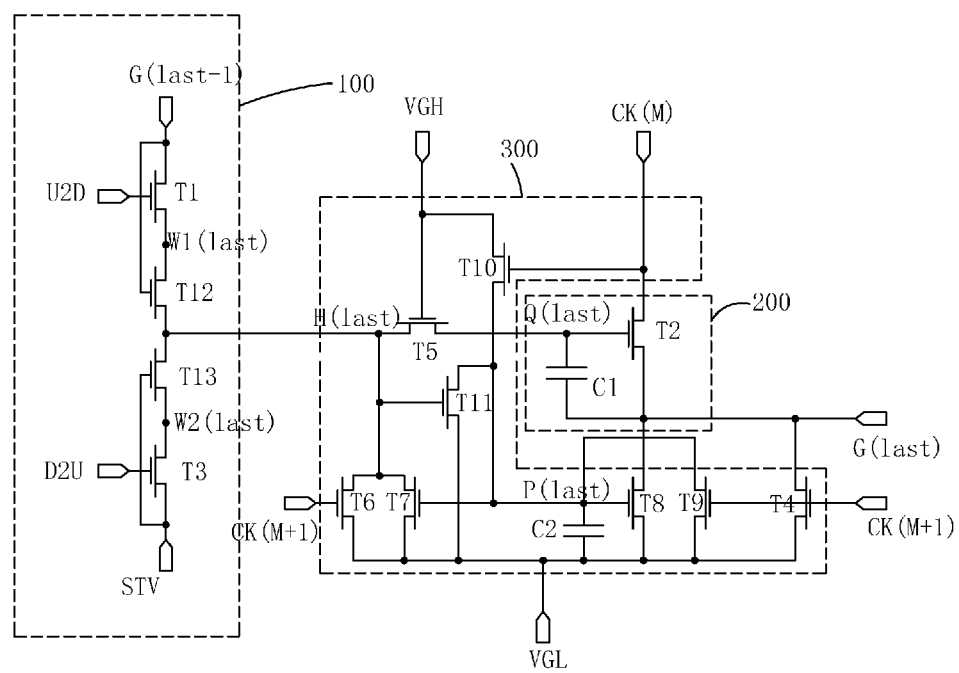
FIG. 8 is a schematic view showing the GOA circuit in the last unit for LTPS-TFT provided by an embodiment of the present invention.

It should be noted that, referring to FIG. 7 and FIG. 8, in the first GOA unit, the drain of the first TFT T1 is connected to a circuit activation signal STV; and in the last GOA unit, the drain of the third TFT T3 is connected to the circuit activation signal STV.

The GOA circuit for LTPS-TFT has both forward scanning and backward scanning capabilities. The forward scan DC control signal U2D and the backward scan DC control signal D2U have opposite voltage levels. When the forward scan DC control signal U2D is high and the backward scan DC control signal D2U is low, the GOA circuit performs forward scanning; when the forward scan DC control signal U2D is low and the backward scan DC control signal D2U is high, the GOA circuit backward scanning.

Figure 5:
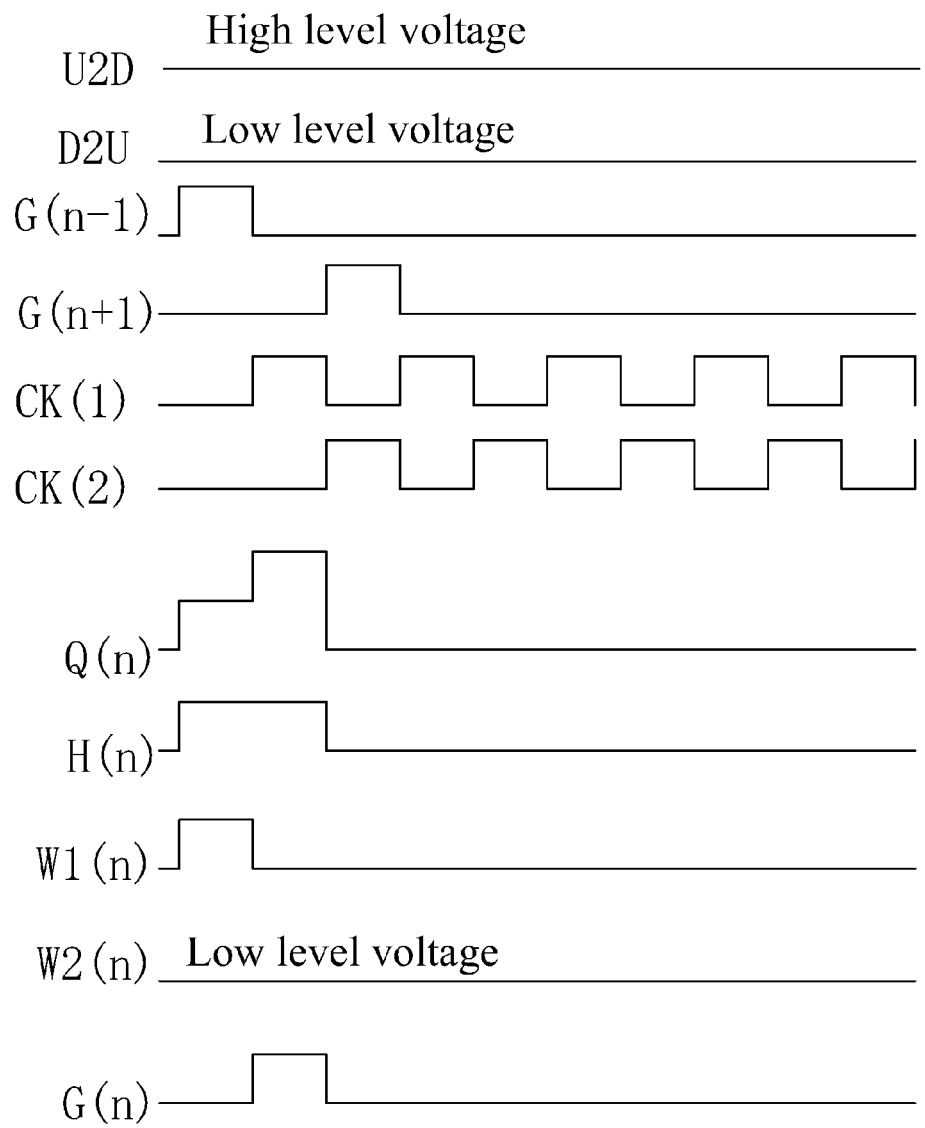
FIG. 5 is a schematic view showing the forward scanning timing for GOA circuit for LTPS-TFT provided by an embodiment of the present invention.
Figure 6:
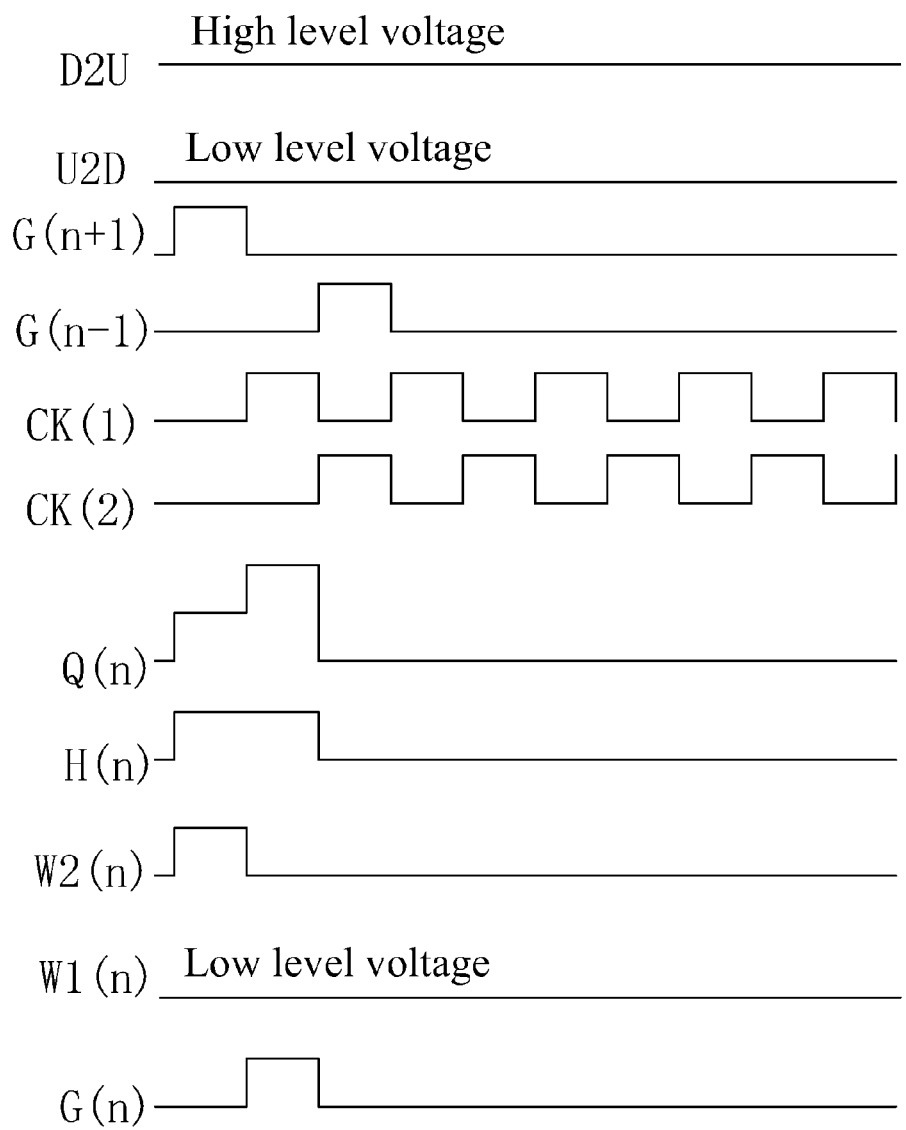
FIG. 6 is a schematic view showing the backward scanning timing for GOA circuit for LTPS-TFT provided by an embodiment of the present invention.

Refer to FIG. 5 and FIG. 6. The clock signal comprises two signals: a first clock signal CK(1) and a second clock signal CK(2), when the M-th clock signal is the second clock signal CK(2), the (M+1)-th clock signal is the first signal CK(1). The output end G(n) of each GOA unit corresponds to a clock signal, for example, the output end of the first GOA unit corresponds to the first clock signal CK(1); the output end of the second GOA unit corresponds to the second clock signal CK(2); the output end of the third GOA unit corresponds to the first clock signal CK(1); the output end of the fourth GOA unit corresponds to the second clock signal CK(2); and so on.

Refer to FIG. 4 and FIG. 5. When the forward scan DC control signal U2D is high and the backward scan DC control signal D2U is low, the GOA circuit performs forward scanning. Specifically, the process is as follows.

Phase 1, pre-charging phase: the output end G(n−1) of the (n−1)-th GOA unit and the forward scan DC control signal U2D are both high, the first and the twelfth TFTs T1, T12 are both conductive, the fourth node W1(n) and the third node H(n) are pulled up to high level, the fifth TFT T5 controlled by the constant high voltage stays conductive, and the first node is pre-charged; the eleventh TFT T11 controlled by the third node H(n) is conductive, and the second node P(n) is pulled down to the constant low voltage VGL.

Phase 2, high voltage output phase: the output end G(n−1) of the (n−1)-th GOA unit becomes low, the twelfth TFT T12 is turned off, the M-th clock signal CK(M) provides a high level voltage, the first node Q(n) stays high under the storage effect of the first capacitor C1, the second TFT T2 controlled by the first node Q(n) is conductive, the high level voltage provided by the M-th clock signal outputs through the second TFT T2 to the output end G(n).

Phase 3, low voltage output phase: the (M+1)-th clock signal provides a high level voltage, the sixth TFT T6 and the fourth TFT T4 are conductive, the third node H(n), the first node Q(n) and the output end G(n) are all pulled down to the constant low voltage VGL.

Phase 4, the output end G(n) and the first node Q(n) low voltage maintaining phase: the third node H(n) becomes low, and the eleventh TFT T11 controlled by the third node H(n) is turned off; the M-th clock signal CK(M) and the (M+1)-th clock signal CK(M+1) provides a high level voltage alternatingly: when the M-th clock signal CK(M) provides a high level voltage, the tenth TFT T10 is conductive, the second node P(n) is pulled up to the constant high voltage VGH, the seventh TFT T7 and the eighth TFT T8 controlled by the second node P(n) become conductive to maintain the third node H(n), the first node Q(n), and the output end G(n) at low voltage; when the (M+1)-th clock signal CK(M+1) provides a high level voltage, the fourth TFT T4 and the sixth TFT T6 are conductive to maintain the third node H(n), the first node Q(n), and the output end G(n) at low voltage, at the same time, the ninth TFT T9 is also conductive, the second node P(n) is pulled down to the low level to turn off the seventh TFT T7 and the eighth TFT T8 to prevent the second node P(n) from staying at high level, which may lead to the instability of the seventh TFT T7 and the eighth TFT T8 due to long time under stress.

Figure 1:
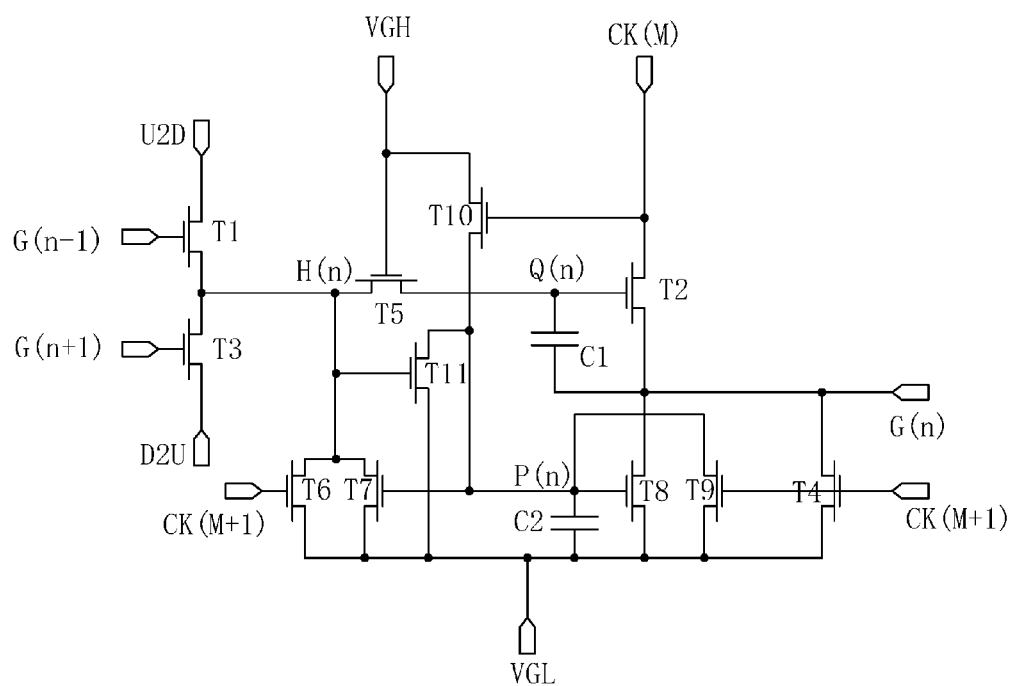
FIG. 1 is a schematic view showing a GOA circuit for known LTPS-TFT.
Figure 2:
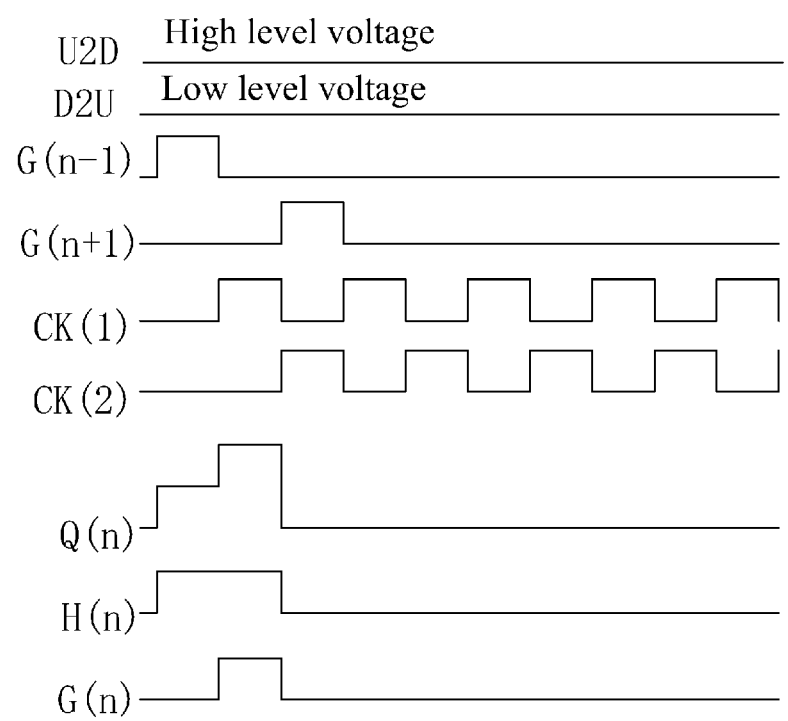
FIG. 2 is a schematic view showing the forward scanning timing for GOA circuit in FIG. 1.
Figure 3:
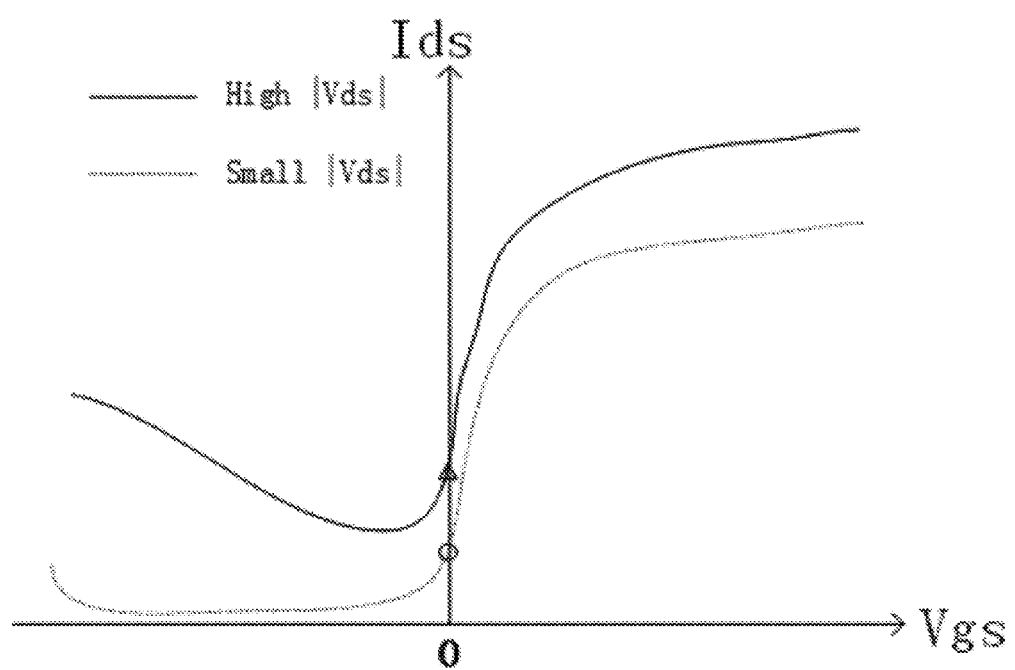
FIG. 3 is a schematic view showing the I-V relation of the TFT under different voltages between the drain and the source.

It should be noted that in the output end G(n) and the first node Q(n) low voltage maintaining phase in forward scanning, because the output end G(n−1) of the (n−1)-th GOA unit provides a low level voltage, the forward scan DC control signal U2D is high, the first TFT T1 is conductive, the fourth node W1(n), i.e., the drain of the twelfth TFT T12, is low, the third node H(n), i.e., the source of the twelfth TFT T12, is low, the gate of the twelfth TFT T12 connected to the output end G(n−1) of the (n−1)-th GOA unit is also low, therefore, the voltage between the gate and the source of twelfth TFT T12 Vgs=0V, and the voltage between the drain and the source Vgs=0V. Also referring to FIG. 3, the leakage of the twelfth TFT T12 is clearly smaller than the known technology. Moreover, in the output end G(n) and the first node Q(n) low voltage maintaining phase, the serially connected third TFT T3 and the thirteenth TFT T13 are both turned off, which also reduce the leakage occurring compared to the known GOA circuit.

Refer to FIG. 4 and FIG. 6. When the backward scan DC control signal D2U is high and the forward scan DC control signal U2D is low, the GOA circuit performs backward scanning. Specifically, the process is as follows.

Phase 1, pre-charging phase: the output end G(n+1) of the (n+1)-th GOA unit and the backward scan DC control signal D2U are both high, the third and the thirteenth TFTs T3, T13 are both conductive, the fifth node W2(n) and the third node H(n) are pulled up to high level, the fifth TFT T5 controlled by the constant high voltage stays conductive, and the first node is pre-charged; the eleventh TFT T11 controlled by the third node H(n) is conductive, and the second node P(n) is pulled down to the constant low voltage VGL.

Phase 2, high voltage output phase: the output end G(n+1) of the (n+1)-th GOA unit becomes low, the thirteenth TFT T13 is turned off, the M-th clock signal CK(M) provides a high level voltage, the first node Q(n) stays high under the storage effect of the first capacitor C1, the second TFT T2 controlled by the first node Q(n) is conductive, the high level voltage provided by the M-th clock signal CK(M) outputs through the second TFT T2 to the output end G(n).

Phase 3, low voltage output phase: the (M+1)-th clock signal provides a high level voltage, the sixth TFT T6 and the fourth TFT T4 are conductive, the third node H(n), the first node Q(n) and the output end G(n) are all pulled down to the constant low voltage VGL.

Phase 4, the output end G(n) and the first node Q(n) low voltage maintaining phase: the third node H(n) becomes low, and the eleventh TFT T11 controlled by the third node H(n) is turned off; the M-th clock signal CK(M) and the (M+1)-th clock signal CK(M+1) provides a high level voltage alternatingly: when the M-th clock signal CK(M) provides a high level voltage, the tenth TFT T10 is conductive, the second node P(n) is pulled up to the constant high voltage VGH, the seventh TFT T7 and the eighth TFT T8 controlled by the second node P(n) become conductive to maintain the third node H(n), the first node Q(n), and the output end G(n) at low voltage; when the (M+1)-th clock signal CK(M+1) provides a high level voltage, the fourth TFT T4 and the sixth TFT T6 are conductive to maintain the third node H(n), the first node Q(n), and the output end G(n) at low voltage, at the same time, the ninth TFT T9 is also conductive, the second node P(n) is pulled down to the low level to turn off the seventh TFT T7 and the eighth TFT T8 to prevent the second node P(n) from staying at high level, which may lead to the instability of the seventh TFT T7 and the eighth TFT T8 due to long time under stress.

It should be noted that in the output end G(n) and the first node Q(n) low voltage maintaining phase in backward scanning, because the output end G(n+1) of the (n+1)-th GOA unit provides a low level voltage, the backward scan DC control signal D2U is high, the third TFT T3 is conductive, the fifth node W2(n), i.e., the drain of the thirteenth TFT T13, is low, the third node H(n), i.e., the source of the thirteenth TFT T13, is low, the gate of the thirteenth TFT T13 connected to the output end G(n+1) of the (n+1)-th GOA unit is also low, therefore, the voltage between the gate and the source of thirteenth TFT T13 Vgs=0V, and the voltage between the drain and the source Vgs=0V. Also referring to FIG. 3, the leakage of the thirteenth TFT T13 is clearly smaller than the known technology. Moreover, in the output end G(n) and the first node Q(n) low voltage maintaining phase in backward scanning, the serially connected first TFT T1 and the twelfth TFT T12 are both turned off, which also reduce the leakage occurring compared to the known GOA circuit In summary, the present invention provides a GOA circuit for LTPS-TFT, by adding the twelfth and thirteenth TFTs controlled by output ends of (n−1)-th and (n+1)-th GOA units, the drain of twelfth TFT connected through the fourth node to the source of first TFT, the drain of first TFT connected to output end of (n−1)-th GOA unit, the drain of thirteenth TFT connected through the fifth node to the source of third TFT, the drain of third TFT connected to the output end of (n+1)-th GOA unit; the first and the third TFTs being controlled respectively by the forward and backward scan DC control signals; when the forward scanning entering the time of output end and first node maintaining low, the fourth being low and able to reduce leakage in twelfth TFT; when the backward scanning entering the time of output end and first node maintaining low, the fifth being low and able to reduce leakage in thirteenth TFT. As such, the leakage in key TFTs is reduced and GOA circuit stability is improved.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A gate driver on array (GOA) circuit for low temperature poly-silicon (LTPS) thin film transistor (TFT), which comprises: a plurality of cascade GOA units, each GOA unit comprising: a forward and backward scan control unit, an output unit and a node control unit;

for a positive integer n, other than the GOA unit in the first and the last stages, in the n-th GOA unit:

the forward and backward scan control unit comprising: a first TFT, with a gate connected to a forward scan DC control signal, a drain connected to an output end of the (n−1)-th GOA unit, and a source connected to a fourth node; a twelfth TFT, with a gate connected to the output end of the (n−1)-th GOA unit, a drain connected to the fourth node, and a source connected to a third node; a third TFT, with a gate connected to a backward scan DC control signal, a source connected to a fifth node, and a drain connected to an output end of the (n+1)-th GOA unit; and a thirteenth TFT, with a gate connected to the output end of the (n+1)-th GOA unit, a drain connected to the fifth node, and a source connected to the third node;

the output unit comprising: a second TFT, with a gate connected to a first node, a source connected to an M-th clock signal, and a drain connected to an output end; and a first capacitor, with one end connected to the first node and the other end connected to the output end;

the node control unit comprising: a fourth TFT, with a gate connected to the (M+1)-th clock signal, a source connected to the output end, and a drain connected to a constant low voltage; a fifth TFT, with a gate connected to a constant high voltage, a source connected to the third node, and a drain connected to the first node; a sixth TFT, with a gate connected to the (M+1)-th clock signal, a source connected to the third node, and a drain connected to the constant low voltage; a seventh TFT, with a gate connected to a second node, a source connected to the third node, and a drain connected to the constant low voltage; an eighth TFT, with a gate connected to the second node, a source connected to the output end, and a drain connected to the constant low voltage; a ninth TFT, with a gate connected to the (M+1)-th clock signal, a source connected to the second node, and a drain connected to the constant low voltage; a tenth TFT, with a gate connected to the M-th clock signal, a source connected to the constant high voltage, and a drain connected to the second node; an eleventh TFT, with a gate connected to the third node, a source connected to the second node, and a drain connected to the constant low voltage; and a second capacitor, with one end connected to the second end and the other end connected to the constant low voltage; and the forward scan DC control signal and the backward scan DC control signal having opposite voltage levels.

2. The GOA circuit for LTPS-TFT as claimed in claim 1, wherein the GOA circuit for LTPS-TFT has both forward scanning and backward scanning capabilities;

when the forward scanning entering the time of the output end and the first node maintaining low level, the voltage between the gate and the source of the twelfth TFT is 0V and the voltage between the drain and the source is 0V, and the third TFT and the thirteenth TFT are both turned off;

when the backward scanning entering the time of the output end and the first node maintaining low level, the voltage between the gate and the source of the thirteenth TFT is 0V and the voltage between the drain and the source is 0V, and the first TFT and the twelfth TFT are both turned off.

3. The GOA circuit for LTPS-TFT as claimed in claim 2, wherein when the forward scan DC control signal is high and the backward scan DC control signal is low, the forward scanning is performed.

4. The GOA circuit for LTPS-TFT as claimed in claim 2, wherein when the forward scan DC control signal is low and the backward scan DC control signal is high, the backward scanning is performed.

5. The GOA circuit for LTPS-TFT as claimed in claim 1, wherein in the first GOA unit, the drain of the first TFT is connected to a circuit activation signal.

6. The GOA circuit for LTPS-TFT as claimed in claim 1, wherein in the last GOA unit, the drain of the third TFT is connected to a circuit activation signal.

7. The GOA circuit for LTPS-TFT as claimed in claim 1, wherein the clock signal comprises two signals: a first clock signal and a second clock signal, when the M-th clock signal is the second clock signal, the (M+1)-th clock signal is the first signal.

8. The GOA circuit for LTPS-TFT as claimed in claim 1, wherein the TFTs are all of the N-type LTPS-TFTs.

9. A gate driver on array (GOA) circuit for low temperature poly-silicon (LTPS) thin film transistor (TFT), which comprises: a plurality of cascade GOA units, each GOA unit comprising: a forward and backward scan control unit, an output unit and a node control unit;

for a positive integer n, other than the GOA unit in the first and the last stages, in the n-th GOA unit:

the forward and backward scan control unit comprising: a first TFT, with a gate connected to a forward scan DC control signal, a drain connected to an output end of the (n−1)-th GOA unit, and a source connected to a fourth node; a twelfth TFT, with a gate connected to the output end of the (n−1)-th GOA unit, a drain connected to the fourth node, and a source connected to a third node; a third TFT, with a gate connected to a backward scan DC control signal, a source connected to a fifth node, and a drain connected to an output end of the (n+1)-th GOA unit; and a thirteenth TFT, with a gate connected to the output end of the (n+1)-th GOA unit, a drain connected to the fifth node, and a source connected to the third node;

the output unit comprising: a second TFT, with a gate connected to a first node, a source connected to an M-th clock signal, and a drain connected to an output end; and a first capacitor, with one end connected to the first node and the other end connected to the output end;

the node control unit comprising: a fourth TFT, with a gate connected to the (M+1)-th clock signal, a source connected to the output end, and a drain connected to a constant low voltage; a fifth TFT, with a gate connected to a constant high voltage, a source connected to the third node, and a drain connected to the first node; a sixth TFT, with a gate connected to the (M+1)-th clock signal, a source connected to the third node, and a drain connected to the constant low voltage; a seventh TFT, with a gate connected to a second node, a source connected to the third node, and a drain connected to the constant low voltage; an eighth TFT, with a gate connected to the second node, a source connected to the output end, and a drain connected to the constant low voltage; a ninth TFT, with a gate connected to the (M+1)-th clock signal, a source connected to the second node, and a drain connected to the constant low voltage; a tenth TFT, with a gate connected to the M-th clock signal, a source connected to the constant high voltage, and a drain connected to the second node; an eleventh TFT, with a gate connected to the third node, a source connected to the second node, and a drain connected to the constant low voltage; and a second capacitor, with one end connected to the second end and the other end connected to the constant low voltage; and the forward scan DC control signal and the backward scan DC control signal having opposite voltage levels;

wherein the GOA circuit for LTPS-TFT has both forward scanning and backward scanning capabilities;

when the forward scanning entering the time of the output end and the first node maintaining low level, the voltage between the gate and the source of the twelfth TFT is 0V and the voltage between the drain and the source is 0V, and the third TFT and the thirteenth TFT are both turned off;

when the backward scanning entering the time of the output end and the first node maintaining low level, the voltage between the gate and the source of the thirteenth TFT is 0V and the voltage between the drain and the source is 0V, and the first TFT and the twelfth TFT are both turned off;

wherein in the first GOA unit, the drain of the first TFT is connected to a circuit activation signal;

wherein in the last GOA unit, the drain of the third TFT is connected to a circuit activation signal.

10. The GOA circuit for LTPS-TFT as claimed in claim 9, wherein when the forward scan DC control signal is high and the backward scan DC control signal is low, the forward scanning is performed.

11. The GOA circuit for LTPS-TFT as claimed in claim 9, wherein when the forward scan DC control signal is low and the backward scan DC control signal is high, the backward scanning is performed.

12. The GOA circuit for LTPS-TFT as claimed in claim 9, wherein the clock signal comprises two signals: a first clock signal and a second clock signal, when the M-th clock signal is the second clock signal, the (M+1)-th clock signal is the first signal.

13. The GOA circuit for LTPS-TFT as claimed in claim 9, wherein the TFTs are all of the N-type LTPS-TFTs.

* * * * *